United States Patent
Albrecht

(10) Patent No.: US 8,421,001 B2
(45) Date of Patent: Apr. 16, 2013

(54) METHOD AND REFERENCE SIGNALING ARRANGEMENT FOR SUPPLYING A PLURALITY OF SYSTEM COMPONENTS WITH A COMMON REFERENCE SIGNAL

(75) Inventor: Adam Albrecht, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 1796 days.

(21) Appl. No.: 11/687,049

(22) Filed: Mar. 16, 2007

(65) Prior Publication Data

US 2007/0233324 A1    Oct. 4, 2007

(30) Foreign Application Priority Data

Mar. 17, 2006   (DE) .......................... 10 2006 012 405

(51) Int. Cl.
    *G01J 1/04*    (2006.01)
(52) U.S. Cl.
    USPC ...................................... 250/227.11; 250/551
(58) Field of Classification Search ............. 250/227.11, 250/551
    See application file for complete search history.

(56) References Cited

U.S. PATENT DOCUMENTS

| | | | | |
|---|---|---|---|---|
| 5,052,799 A | * | 10/1991 | Sasser et al. | ............. 356/139.03 |
| 5,869,966 A | | 2/1999 | Gatehouse | |
| 2007/0008547 A1 | * | 1/2007 | Hill et al. | ...................... 356/498 |

FOREIGN PATENT DOCUMENTS

| | | |
|---|---|---|
| DE | 42 00 992 A1 | 7/1993 |
| DE | 197 22 221 A1 | 12/1998 |
| DE | 101 48 442 C2 | 7/2003 |
| EP | 0 350 120 A1 | 1/1990 |

* cited by examiner

*Primary Examiner* — Seung C Sohn
(74) *Attorney, Agent, or Firm* — Schiff Hardin LLP

(57) ABSTRACT

A method for supplying a plurality of system components of a system with a common reference signal is described, in which an electrical output reference signal is created by a reference signal generator and a number of optical reference signals are generated using the electrical output reference signal. The optical reference signals are transmitted to the individual system components, and an electrical input reference signal for the corresponding system component is generated at or in the system component using the transferred optical reference signal. A corresponding reference signaling arrangement, a reference signal transmission facility, an electro-technical system having a number of system components and a system component for the system are also provided.

17 Claims, 4 Drawing Sheets

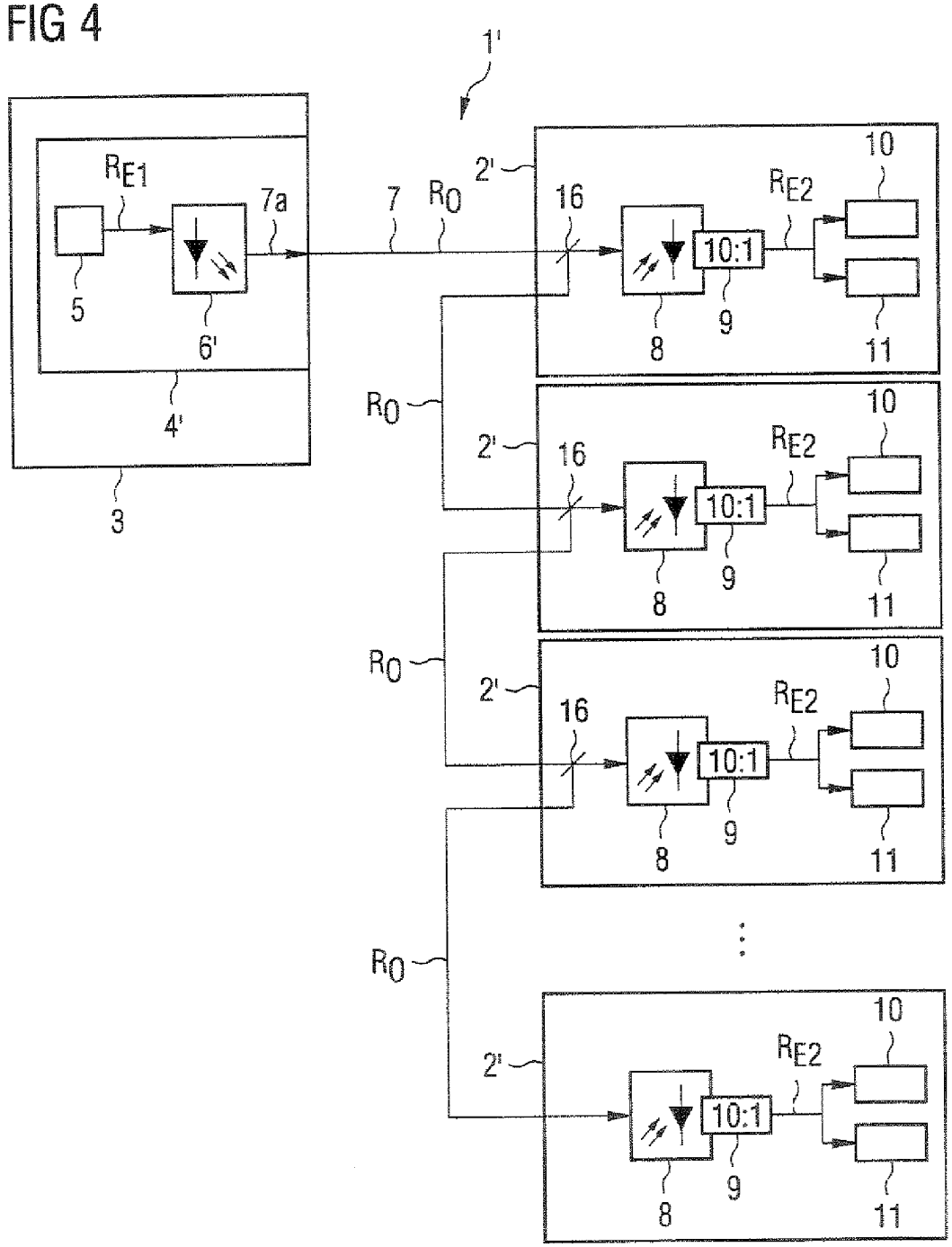

METHOD AND REFERENCE SIGNALING ARRANGEMENT FOR SUPPLYING A PLURALITY OF SYSTEM COMPONENTS WITH A COMMON REFERENCE SIGNAL

BACKGROUND OF THE INVENTION

1. Field of the Invention

The invention relates generally to a method for supplying a plurality of system components of an electro-technical system with a common reference signal. In addition, the invention relates to a corresponding reference signaling arrangement for supplying a plurality of system components of an electro-technical system with a common reference signal. In addition, the invention relates to a reference signaling facility, an electro-technical system comprising a number of system components and a system component for the system.

2. Description of the Related Art

At present many electro-technical systems, for example electro-technical devices or subassemblies or subassembly arrangements, are of a modular design. This is true especially of medical engineering systems such as magnetic resonance systems or computer tomography systems.

To synchronize the functions of the individual components of such medical engineering systems, the appropriate control signals must be sent to the components. Thus, for example European Patent Document EP 0 350 120 A1 describes how different magnetic field generators and the transmitters/receivers of a magnetic resonance system are controlled for transmission and receipt of the radio frequency signals from a common open-loop and closed loop control unit. This control is usually undertaken over a data bus. To this end, German Patent Document DE 197 22 221 A1 proposes implementing part of the bus as an optical bus, in which the control signals are transmitted over an optical fiber in order to avoid the interference within the radio frequency range caused by electrical control signals. For the same reasons, U.S. Pat. No. 5,869,966 proposes transmitting a switching signal for activating and deactivating a radio-frequency antenna in a magnetic resonance system by means of an optical fiber link from a control device to the radio-frequency antenna. For this reason too it is proposed in German Patent Document DE 42 00 992 A1 that the received magnetic resonance signals first be prepared and convened into optical signals and then transmitted optically to the controller located outside the radio frequency area. In this case the control signals needed and the energy needed in the radio frequency range for signal preparation are made available using non-electrical methods, e.g. via optical signals or thermal energy transmission methods. Furthermore, a method is specified in German Patent Document DE 101 48 442 C2 for preparing the magnetic resonance signals in a suitable manner for such transmission over optical fibers.

Furthermore a common reference signal, for example a clock signal, is often needed for precise timing of the synchronization of the individual system components or modules. A typical example is a modern magnetic resonance system, in which it is possible to activate different antenna elements or modes separately, to emit radio frequency pulses over the relevant antenna elements or in the relevant modes, or to receive magnetic resonance signals via the relevant antenna element or in the mode. For this to be done a separate transceiver element is needed for each antenna element or each mode. These transceiver components must operate synchronized with each other.

To supply the different components of an electro-technical system with reference signals a suitable electronic reference signal has previously usually been generated by a reference signal generator and distributed over electrical paths to the wide diversity of components. FIG. 1 shows a typical layout of such a conventional reference signaling arrangement. As a rule, the reference signal is generated with a VCO (Voltage Controlled Oscillator) and transferred to an amplifier which passes the electrical reference signal to a so-called "splitter" in which the reference signal is split up over the desired N transmission channels, with N being the number of the system components to be supplied. The reference signals are generally transferred from the splitter to the individual components over coaxial cables. Each of the system components has a defined input impedance which operates as an electrical load at the end of the respective coaxial cable.

This distribution method has various disadvantages. On the one hand, a significant output power of the reference signal generator is necessary for a larger number of system components to be supplied. Furthermore each load, i.e. each system component, connected at the end of a coaxial line, has a specific coefficient of reflection. This reduces the electrical isolation between the outputs of the splitter and thereby increases the risk of crosstalk between the individual system components. The multiple reflections can also cause a significant deterioration in the signal quality of the reference signal to be distributed. In addition, the distance between the output of the splitter and the input of the individual system components should not be too great, since otherwise the maximum permissible frequency of the reference signal is very restricted. The concepts currently employed are thus only sufficiently good if the number of system components to be supplied is small and the components are preferably arranged in a housing or especially preferably on a circuit board. In addition, the frequency of the reference signal is almost always greatly restricted. This means that as a rule reference signals with a frequency of over 100 MHz cannot currently be transmitted.

SUMMARY OF THE INVENTION

It is thus an object of the present invention to provide a method and corresponding devices for supplying a plurality of system components of an electro-technical system with a common reference signal, with which the above-mentioned disadvantages are avoided even with a plurality of system components at greater distances from each other.

This and other objects and advantages is achieved by a method as well as by a reference signaling arrangement, a system, a reference signal transmission facility and a system component.

In the inventive method—as in the prior art—an electrical reference signal, especially a clock signal, is initially generated by a reference signal generator. This is referred to below as the electrical output reference signal. A number of optical reference signals, which can be transmitted to the individual system components on the basis of this electrical output reference signal, are then created. Subsequently an electrical input reference signal for the relevant system components is then created on or in the system components in each case on the basis of the transferred optical reference signal. The optical signal can in this case be any given signal within the visible or invisible optical frequency spectrum.

With the inventive method the reference signal is thus converted twice. For example, the electrical reference signal is first converted into one or more optical reference signals which are then distributed using an optical distribution system to the individual system components, so that an optical reference signal can be provided for each of the system components, and these optical reference signals are then converted once more into electrical reference signals for the relevant system components. The overall transmission of the reference signals can thus be undertaken on optical paths, for example using optical fibers.

This method of operation has a number of advantages. It means that the individual system components and the reference signal generator can be electrically isolated to avoid crosstalk between different modules. Optical signal transmission also allows a higher reference signal frequency on longer links by comparison with distribution with coaxial cables. In addition a particularly powerful reference signal generator is not required, regardless of the number of system components to be supplied. In magnetic resonance systems in particular, transmission using optical fibers also has the advantage that the sensitive antennas must not be disturbed by the reference signal and conversely there should be no disturbances generated for example by the relatively strong pulses for switching the gradient fields that can intrude into the reference signal.

A corresponding inventive reference signaling arrangement first needs a reference signal generator for creating an electrical output reference signal. Furthermore, the reference signaling arrangement must comprise a first signal conversion facility coupled to the reference signal generator, which generates a number of optical reference signals on the basis of the electrical output reference signal. Furthermore, the reference signaling arrangement needs an optical fiber system in order to transmit an optical reference signal to each of the individual system components, as well as a number of second signal conversion facilities, in order to generate at the individual system components an electrical input reference signal for the relevant system component based in each case on the transferred optical reference signal.

An inventive reference signal transmission device for such a reference signaling arrangement thus needs a corresponding reference signal generator for generation of the electrical output reference signal, a first signal conversion facility coupled to the reference signal generator which generates a number of optical reference signals on the basis of the electrical output reference signal, as well as a corresponding number of signal outputs for the optical reference signals which can be connected to the optical fiber system.

The invention additionally comprises an electro-technical system, preferably a medical imaging system, and in a specific example a computer tomography system or magnetic resonance tomography system, which features a number of system components as well an inventive reference signaling arrangement.

An inventive system component which is able to be used within the framework of such an electro-technical system, has an input for connection of the optical fiber system for receiving an optical reference signal as well as a second signal conversion facility for generating an electrical input reference signal on the basis of a received optical reference signal for the relevant system components. It is thus the object of the present invention to create a method and corresponding devices for supplying a plurality of system components of an electro-technical system with a common reference signal, with which the above-mentioned disadvantages are avoided even with a plurality of system components at greater distances from each other.

BRIEF DESCRIPTION OF THE DRAWINGS

FIG. 4 is a schematic block diagram of an inventive reference signaling arrangement according to a second exemplary embodiment. FIG. 1 a schematic block diagram of a reference signal transmission facility with an electrical distribution of the electrical reference signals according to the prior art,

DETAILED DESCRIPTION OF THE PREFERRED EMBODIMENTS

Figure 1:
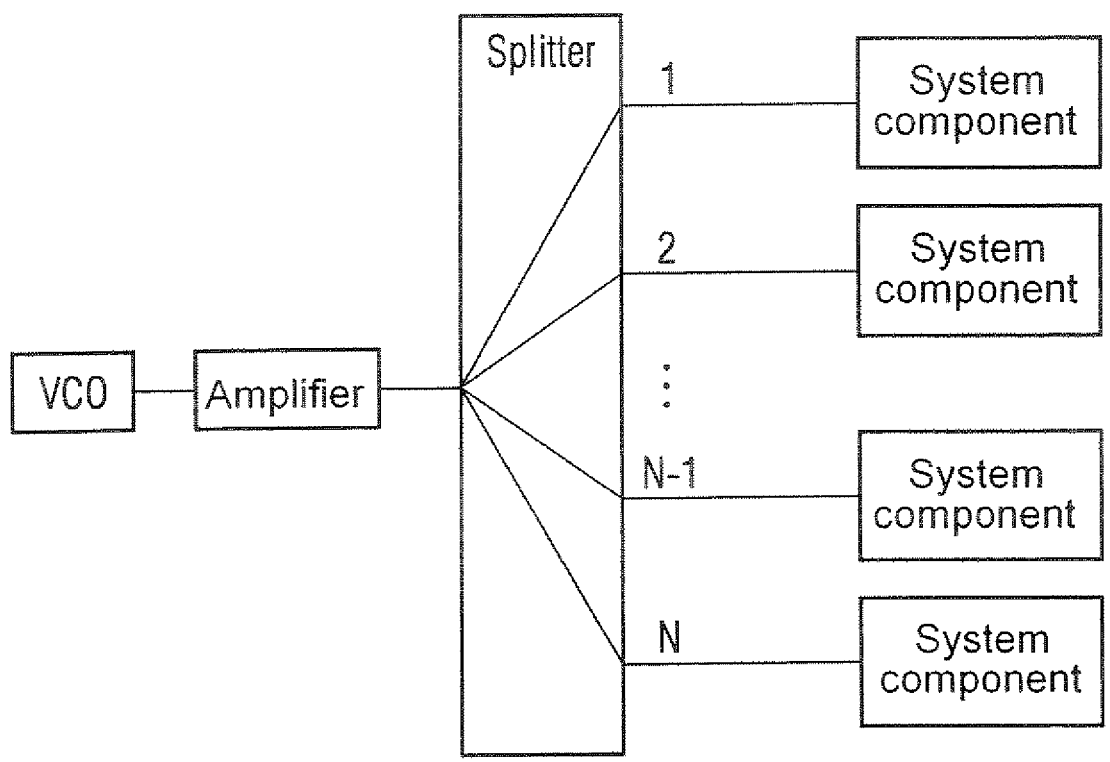
FIG. 1 is a schematic block diagram of a reference signal transmission facility with an electrical distribution of the electrical reference signals according to the prior art.

The preferred embodiments of the invention each provide further advantages. The inventive method can be further developed as to the reference signaling arrangement and vice versa. Likewise the inventive reference signal transmission unit, the inventive system component and the inventive electro-technical system can be further developed according to the method.

In a preferred exemplary embodiment, the first signal conversion facility is embodied so that a plurality of optical reference signals transmitted in parallel are generated directly on the basis of the electrical output reference signals. This means that the electrical output reference signal is converted directly into a plurality of optical reference signals.

In an especially simple and thus preferred implementation of the exemplary embodiment, the first signal conversion facility comprises a circuit arrangement with a plurality of light emitting components, coupled to the reference signal generator in a suitable manner, so that, in order to generate the optical reference signals, the light emitting components are operated as a function of the electrical output reference signal. The light emitting components concerned are preferably light emitting diodes. For example semiconductor lasers or other such components can also be used which emit light in the visible or the invisible frequency spectrum.

For example, with an especially preferred design, the light emitting components can be switched in series and can be connected to a current source and a circuit element such that a current flows through the light emitting components depending on a switch position of the circuit element. The circuit element in this case is connected to the reference signal generator so that the circuit element is switched as a function of the electrical output reference signal. This has the advantage that, independently of the number of light emitting, elements to be operated—for example the light emitting diodes, which are usually current controlled—the output reference signal must only have a relatively low output power that is sufficient to switch the circuit element.

To enable the switching times of the circuit element to be defined as exactly as possible, there is preferably a voltage limitation element, for example an amplifier or the like operating as a voltage limiter, located between the reference signal generator and the switching element.

Alternately it is also possible to split up an optical reference signal that is generated on the basis of the electrical output reference signal so as to generate a plurality of optical reference signals for the individual system components. To this end the reference signaling arrangement must feature one or more suitable optical signal splitters, with commercially available signal splitters, for example semi-transparent mirrors, fiber-optic signal splitters or similar devices being able to be used.

This optical signal division enables a plurality of optical reference signals to be generated, in that a specific proportion of the light is split off at a signal splitter and for example a number of such signal splitters are connected one after the other in a cascade. Likewise however signal splitters can also be used which divide up the incoming optical signal directly into more than two separate optical signals.

In this case optical amplifiers can also be used which amplify the optical signal again if, as a result of the frequent splitting, the signals exhibit an intensity which is too low for further transfer.

In a preferred exemplary embodiment the reference signaling arrangement features at least one second signal conversion facility which is designed so that an input reference signal is generated for the relevant system component of which the frequency is less than the output reference signal. To this end the second signal conversion facility can preferably feature a frequency divider.

A reference signal can then he transmitted by the reference signal transmission facility with a frequency which is higher than would actually be required at the individual system components. At the destination, the reference signal can then be decremented in order to obtain the desired reference signal frequency. The advantage of this is that phase noise which inevitably always occurs can be better suppressed.

This method is therefore especially possible with the inventive process, because—as already explained above—transmission is possible over an optical distribution system without further higher signal frequencies.

The invention is explained below with reference to the enclosed Figures on the basis of exemplary embodiments. Components which are the same or similar names are labeled with the same reference symbols here.

FIG. 1 has already been explained in detail above in order to illustrate the disadvantages of the reference signaling arrangement previously employed. In such a conventional system the reference signal that is generated and amplified by the reference generator is split up in a splitter into the required number of reference signals and these are then transmitted via coaxial leads to the individual system components.

By contrast, in an inventive system (see FIG. 2 for example) the reference signal $R_{E1}$ coming from a reference signal generator 5, which is labeled here as the output reference signal $R_{E1}$, is initially converted in a first signal converter 6 into a number of optical reference signals $R_O$. The reference signal generator 5 involved can be a normal VCO.

Figure 2:
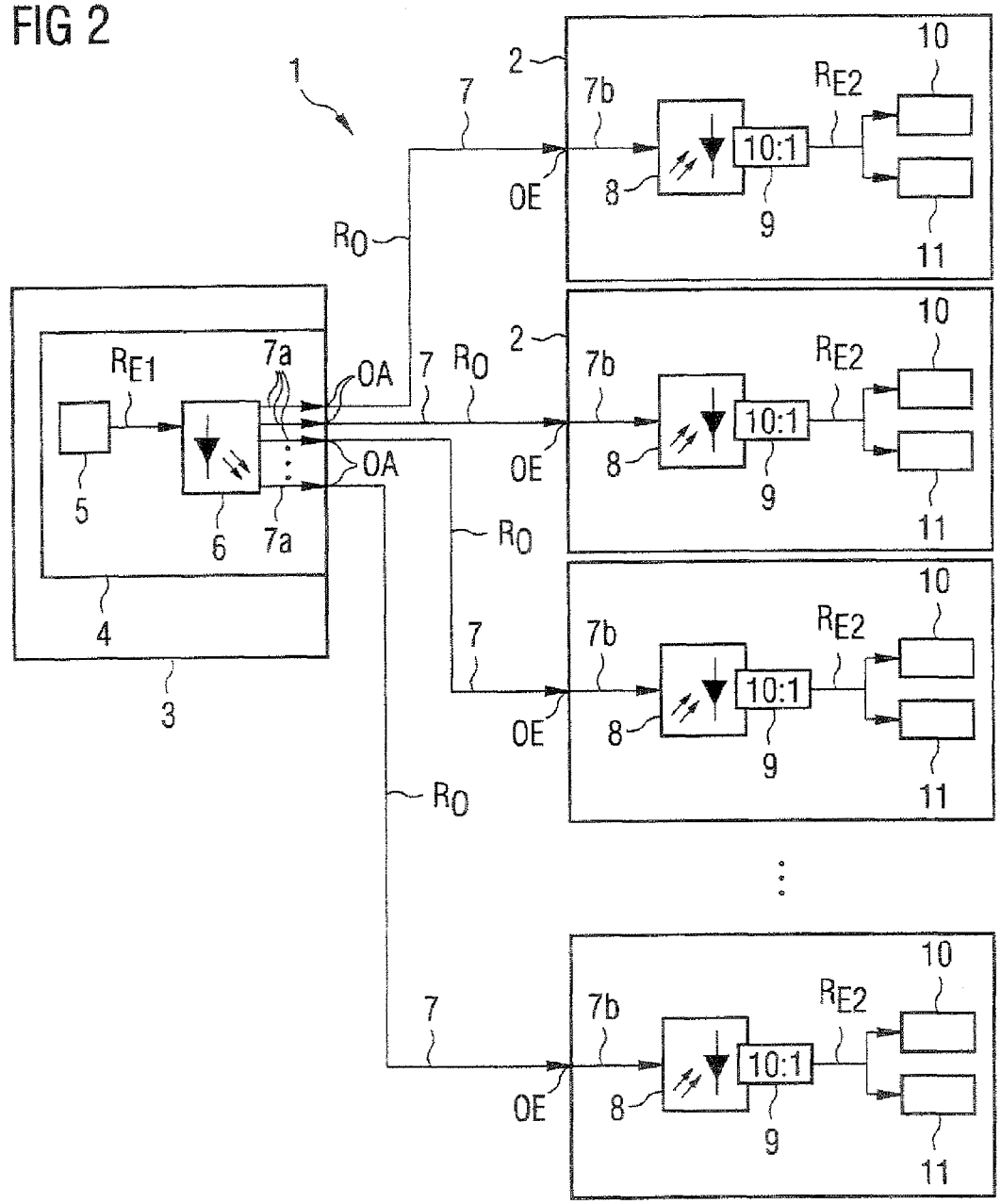
FIG. 2 is a schematic block diagram of an inventive reference signaling arrangement according to a first exemplary embodiment.

In the exemplary embodiment shown in FIG. 2, the first signal conversion facility 6 insures in this case that the output reference signal $R_{E1}$ is convened directly into a plurality of optical reference signals $R_O$ that are transmitted in parallel. The reference signal transmission facility 4 which comprises the reference signal generator 5 and the first signal conversion facility 6, features a corresponding number of optical outputs OA to which the optical reference signals $R_O$ are output in parallel, These optical reference signals $R_O$ are then transmitted via optical fibers 7 to the different system components 2.

The individual system components 2 each have an optical signal input OE to receive the optical reference signal $R_O$. The incoming optical reference signal $R_O$ is then converted by a second signal conversion facility or device 8 located in the respective system component 2 back into an electrical signal $R_{E2}$. To this end, the second signal conversion facility 8 has a suitable circuit arrangement with for example a photo diode, which generates on the basis of the received light signal $R_O$ an electrical signal $R_{E2}$ which is then correspondingly amplified and post processed. In this case it should be insured that a sufficiently good phase stability—especially of the signal edges—is achieved during conversion and a reproducible and defined internal signal delay is produced during the conversion in order not to generate any phase shift of the signals relative to one another.

In the exemplary embodiment shown the electro-technical system 1, which includes the various system components 2, is a magnetic resonance system 1. The system components 2 shown, which require the reference signal here, are the transceiver components 2 of this magnetic resonance system 1 in each case. The transceiver components 2 in this case usually feature a transmitter unit 10 from which via an antenna (not shown) or antenna element for executing the magnetic resonance measurement, a radio frequency signal, is transmitted in order to induce a magnetic resonance signal in a sample volume. On the other hand, these transceiver components 2 each comprise a receiver unit 11, with which the induced magnetic resonance signal can be received and preprocessed via the relevant antenna component.

It is clear that in such a system 1 the different transceiver components 2 must operate so that they are very precisely synchronized with each other. To this end these components 2 receive a reference signal which is generated by the reference signal generator 5 and transmitted in the inventive manner to the individual transceiver components 2. The reference signal transmission facility 4 is contained here for example in a host processor 3, which also contains the further control components for the magnetic resonance tomography system 1. Basically, the reference signal transmission facility 4 can however also be arranged in another part of the magnetic resonance tomography system. As well as this, this magnetic resonance tomography system 1 also features all further components which are usually needed in such a system 1. These necessary components are known to the person skilled in the art, as is the method of operation of a magnetic resonance system and thus they do not need to be explained and presented in further detail in this document. If the system features additional system components which must also operate in synchronization with the transceiver components 2, the reference signal can be transmitted in the same manner to these components as well.

In the exemplary embodiment shown in FIG. 2 the second signal conversion facility 8 also includes a frequency divider 9. It is thus insured that the electrical input signal $R_{E2}$ generated in the second signal conversion facility 8 has a frequency which is lower by a factor of 10 than the optical reference signal $R_O$ or the original output reference signal $R_{E1}$.

For example, an output reference signal $R_{E1}$ with 100 MHz can be generated by the reference signal generator 5. This reference signal $R_{E1}$ is then converted into the desired optical reference signals $R_O$, and when the signal is transformed back into an electrical input reference signal $R_{E2}$ in the individual system components 2 the frequency is divided down into 10 MHz. This electrical reference signal $R_{e2}$ can then be transmitted in the individual transceiver components 2 to the transmitter unit and the receiver unit, which each operate with the same reference signal, in order for example to achieve an upwards conversion of the transmit signal and a downwards conversion of the receive signal with the known method.

Figure 3:
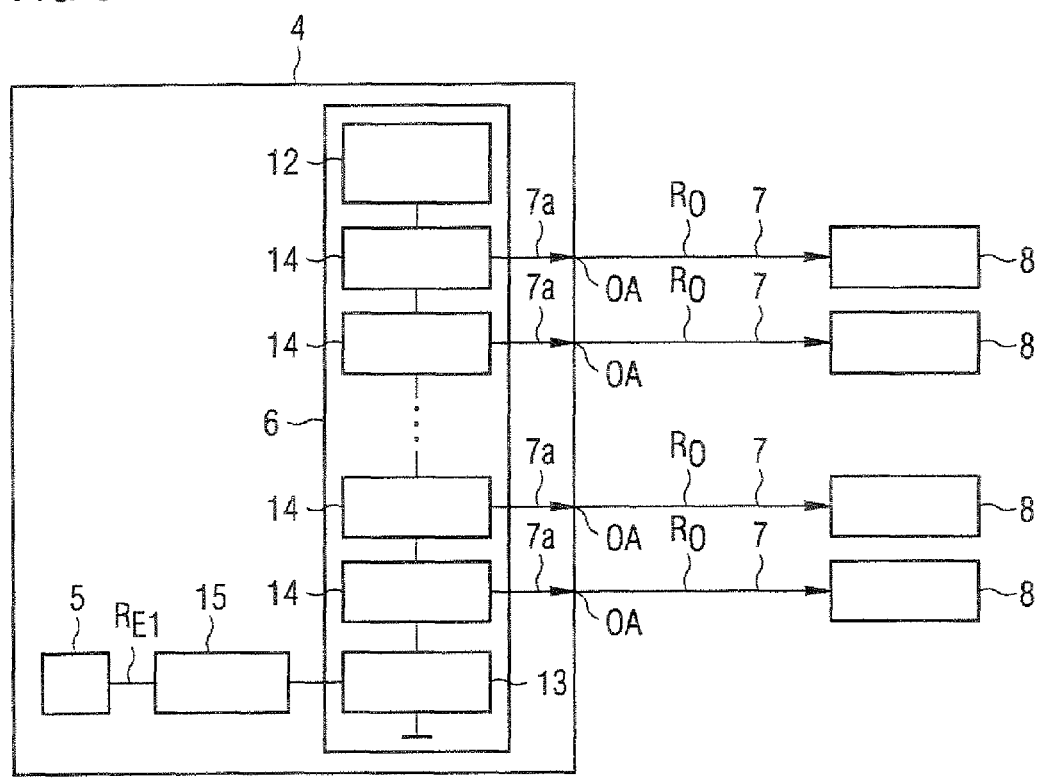
FIG. 3 is a more detailed presentation of the reference signal transmission facility of the reference signaling arrangement depicted in FIG. 2.

The precise structure of the reference signal transmission facility 4 is shown once again in FIG. 3. The transmission of the individual optical reference signals $R_O$ over the optical fibers 7 to the second signal conversion facility 8 in the system components is again shown in rough schematic form in this figure. The second signal conversion facilities 8 also do not have to be arranged directly in the system components 2 but can also be arranged in the vicinity of these system components 2.

A central component of the reference signal transmission facility 4 is the first signal conversion facility 6 which consists here of a number of series-connected light emitting diodes 14 which are connected on one side to a current source 12 and on the other side to a switch 13. This switch 13 is controlled by means of the electrical output reference signal $R_{E1}$ generated by the reference signal generator 5. Prior to this however this output reference signal $R_{E1}$ is amplified by an amplifier 15 which simultaneously operates as a limiter 15. This means that a more exact switching point is achieved by the reference signal $R_{E1}$.

The circuit element 13 is what is known as an SPST (SINGLE POLE SINGLE THROW) switch, and preferably is a relatively fast transistor switch. If this switch 13 is closed, the current passes from the current source 12 through all series-connected light emitting diodes 14 and thus creates an optical signal. If on the other hand switch 13 is open, no light signal is generated in the light emitting diodes 14. Thus, the electrical reference signal $R_{E1}$ ca accordingly be converted simultaneously into a number of parallel optical reference signals $R_O$.

The light generated by the individual light emitting diodes 14 is coupled into the optical fiber 7 for transmission in the usual manner. In the exemplary embodiment shown the light is initially coupled into the optical fiber section 7a within the reference signal transmission facility 4 which lead to corresponding optical signal outputs OA, An optical fiber 7 can then be connected in the usual manner to these optical signal outputs OA so that the optical signal $R_O$ is coupled over from the signal output OA into the relevant optical fibers 7

In the same manner the individual system components 2 can each feature optical inputs OE to allow connection of the optical fibers. Optical fiber sections 7b then lead in the system components 2 in each case from the optical inputs OE to the second signal conversion facilities 8.

FIG. 4 shows a second exemplary embodiment for the inventive reference signaling arrangement. The difference between this arrangement and the reference signaling arrangement depicted in FIG. 2 lies in the fact that the first signal conversion facility 6' within the reference signaling transmission device 4' is embodied here so that only one optical reference signal $R_O$ is generated. This is then split up later into a number of optical reference signals $R_O$. In the exemplary embodiment shown in FIG. 4 this is done with the aid of beam splitters 16 in the form of partly-transparent mirrors which are arranged in the system components 2' in each case. This means that a part of the optical reference signal $R_O$ arriving at a system component is coupled out and passed on to a further system component 2 as an optical reference signal $R_O$. Only a smaller part of the signal intensity actually reaches the second signal conversion facility 8 in the relevant component 2 and is converted there into the electrical input reference signal $R_{E2}$. With these methods a plurality of system components 2 can be lined one after the other as regards the reference signal transmission to form a sort of "daisy chain".

In conclusion it is pointed out once more that the method described above in detail, in addition to the reference signaling arrangements and systems shown, only relates to exemplary embodiments, which can be modified by the person skilled in the art in a wide diversity of ways without departing from the field of the invention. Thus for example, instead of the beam splitters 16 in the form of semi-transparent mirrors shown here, fiber-optic beam splitters can also be employed. Likewise it is possible to arrange these beam splitters 16 at other locations, for example still within the reference signal transmission facility 4', and to couple out a plurality of optical reference signals in an optical manner at this location from a first optical reference signal $R_O$. Likewise, other options can also be used however in order to generate directly from an electrical output reference signal $R_{E1}$ a plurality of optical reference signals $R_O$. Thus for example, instead of a series circuit of light emitting elements or light emitting diodes, as is shown in FIG. 3, parallel-connected light emitting diodes can also be activated. However the advantage of the series circuit is that the output power of the reference signal generator does not have to be selected as a function of the number of light emitting diodes operated.

The invention has been described above using examples referring to a magnetic resonance tomography system in the medical field. However the invention is able to be used in any other areas of application or systems in which a plurality of system components need the same reference signal.

Although other modifications and changes may be suggested by those skilled in the art, it is the intention of the inventor to embody within the patent warranted hereon all changes and modifications as reasonably and properly come within the scope of his contribution to the art.

I claim:

1. A method for supplying a plurality of system components of a system with a common reference signal, comprising the steps of:
   generating an electrical output reference signal by a reference signal generator;
   generating a number of optical reference signals using the electrical output reference signal;
   transmitting the optical reference signals to individual ones of the system components; and
   generating an electrical input reference signal for corresponding ones of the system components at the respective system component using the transmitted optical reference signal in each case.

2. A method as claimed in claim 1, wherein the electrical output reference signal is converted directly into a plurality of optical reference signals.

3. A method as claimed in claim 2, further comprising the step of:
   operating a plurality of light emitting components to generate the optical reference signals depending on the electrical output reference signal.

4. A method as claimed in claim 3, further comprising the step of:
   conducting an electrical current depending on a switch position of a circuit element for generation of the optical reference signals by a plurality of series-connected light emitting components, said switch position of said circuit element in its turn depending on the electrical output reference signal.

5. A method as claimed in claim 1, further comprising the step of:
   optically splitting the optical reference signal for creating a plurality of optical reference signals.

6. A method as claimed in claim 1, further comprising the step of:
   generating an input reference signal having a frequency lower than a frequency of the output reference signal.

7. A reference signaling arrangement for supplying a plurality of system components of an electro-technical system with a common reference signal, comprising:
   a reference signal generator connected for creating an electrical output reference signal;

a first signal conversion apparatus coupled to said reference signal generator and operable to create a plurality of optical reference signals from the electrical output reference signal;

an optical fiber system connected to said first signal conversion apparatus and operable to transmit the optical reference signals to individual ones of the plurality of system components; and a plurality of second signal conversion apparatuses connected to said optical fiber system and operable to generate at individual ones of the plurality of system components from the individual ones of the optical reference signals an electrical input reference signal for corresponding ones of the plurality of system components.

8. A reference signaling arrangement as claimed in claim 7, wherein said first signal conversion apparatus is constructed and operable to generate a plurality of optical reference signals directly from the electrical output reference signal.

9. A reference signaling arrangement as claimed in claim 8, wherein said first signal conversion apparatus includes a circuit arrangement with a plurality of light emitting components which are coupled to said reference signal generator.

10. A reference signaling arrangement as claimed in claim 9, further comprising: a current source and a circuit element, said circuit element having switch positions;

said light emitting components being connected in series and being linked to said current source and said circuit element such that depending on a switch position of said circuit element a current flows through said light emitting components, said circuit element being connected to said reference signal generator so that said circuit element is switched depending on the electrical output reference signal.

11. A reference signaling arrangement as claimed in claim 10, further comprising:

a voltage-limiting element connected between said reference signal generator and said circuit element.

12. A reference signaling arrangement as claimed in claim 7, further comprising:

an optical signal divider connected to split up an optical reference signal to provide said optical reference signals.

13. A reference signaling arrangement as claimed in claim 7, wherein at least one of said second signal conversion apparatuses is configured to generate an electrical input reference signal at an output of said one of said second signal conversion apparatuses that has a lower frequency than a frequency of the optical reference signal received by said one of said second signal conversion apparatuses.

14. A reference signaling arrangement as claimed in claim 13, wherein said one of said second signal conversion apparatuses comprises a frequency divider.

15. An electro-technical system comprising:

a plurality of system components; and a reference signaling arrangement for supplying the system components with a common reference signal, said reference signaling arrangement including:

a reference signal generator connected for creating an electrical output reference signal;

a first signal conversion apparatus coupled to said reference signal generator and operable to create a plurality of optical reference signals from the electrical output reference signal;

an optical fiber system connected to said first signal conversion apparatus and operable to transmit the optical reference signals to individual ones of the plurality of system components; and a plurality of second signal conversion apparatuses connected to said optical fiber system and operable to generate at individual ones of the plurality of system components from the individual ones of the optical reference signals an electrical input reference signal for corresponding ones of the plurality of system components.

16. An electro-technical system as claimed in claim 15, wherein said electro-technical system is a medical engineering system.

17. An electro-technical system as claimed in claim 16, wherein said medical engineering system includes one of a computer tomography system and a magnetic resonance tomography system.

\* \* \* \* \*